(12) United States Patent
Heo

(10) Patent No.: US 10,714,547 B2
(45) Date of Patent: Jul. 14, 2020

(54) LIGHT EMITTING DISPLAY APPARATUS AND METHOD OF MANUFACTURING THE SAME

(71) Applicant: LG Display Co., Ltd., Seoul (KR)

(72) Inventor: Joonyoung Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/195,509

(22) Filed: Nov. 19, 2018

(65) Prior Publication Data

US 2019/0165062 A1 May 30, 2019

(30) Foreign Application Priority Data

Nov. 30, 2017 (KR) .................. 10-2017-0163572

(51) Int. Cl.
*H01L 51/52* (2006.01)
*H01L 27/32* (2006.01)
*H01L 51/50* (2006.01)

(52) U.S. Cl.
CPC ...... *H01L 27/3246* (2013.01); *H01L 27/3248* (2013.01); *H01L 27/3258* (2013.01); *H01L 51/525* (2013.01); *H01L 51/5209* (2013.01); *H01L 51/5218* (2013.01); *H01L 51/5271* (2013.01); *H01L 27/322* (2013.01); *H01L 27/3213* (2013.01); *H01L 51/5044* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 9,881,980 B2 * | 1/2018 | Paek | H01L 27/3246 |
| 9,923,170 B2 * | 3/2018 | Kim | H01L 51/5259 |
| 2015/0097171 A1 * | 4/2015 | Kim | H01L 27/3246 257/40 |
| 2017/0278910 A1 * | 9/2017 | Choi | H01L 27/322 |

FOREIGN PATENT DOCUMENTS

| | | |
|---|---|---|
| KR | 10-2014-0061059 A | 5/2014 |
| KR | 10-2016-0137715 A | 12/2016 |

* cited by examiner

*Primary Examiner* — Minh Loan Tran
(74) *Attorney, Agent, or Firm* — Seed IP Law Group LLP

(57) ABSTRACT

Provided is a light emitting display apparatus including a first substrate, a first electrode on the first substrate, a bank layer having an opening exposing a portion of the first electrode layer, a bank recess depressed on the bank layer, a second electrode layer on the first electrode layer and the bank layer, and a cover layer covering a lower surface and an inner side surface of the bank recess.

12 Claims, 16 Drawing Sheets

(a)

(b)

LIGHT EMITTING DISPLAY APPARATUS AND METHOD OF MANUFACTURING THE SAME

CROSS-REFERENCE TO RELATED APPLICATIONS

This application claims the benefit of Korean Patent Application No. 10-2017-0163572, filed on Nov. 30, 2017, which is incorporated herein by reference for all purposes as if fully set forth herein.

BACKGROUND

Technical Field

The present disclosure relates to a light emitting display apparatus and a method of manufacturing the same.

Description of the Related Art

With the development of information technology, the market for display apparatuses, a connection medium between users and information, has expanded. Accordingly, the use of display apparatuses such as light emitting displays, liquid crystal displays (LCDs), and plasma display panels (PDPs), has been increased.

Among the display apparatuses mentioned above, the light emitting display apparatus includes a display panel including a plurality of subpixels, a driver for driving the display panel, and a power supply unit for supplying power to the display panel. The driver includes a scan driver for supplying a scan signal (or a gate signal) to the display panel and a data driver for supplying a data signal to the display panel.

In the light emitting display apparatus, when a scan signal, a data signal, or the like, are supplied to subpixels arranged in a matrix form, a light emitting diode (LED) of a selected subpixel emits light, displaying an image. The light emitting display apparatus is classified as a bottom emission type in which light is emitted in a direction toward a lower substrate and a top emission type in which light is emitted in a direction toward an upper substrate.

The light emitting display apparatus, which displays an image on the basis of light generated by the LED included in the subpixel, has various advantages as it comes to prominence as a next-generation display apparatus. However, there is a problem yet to be solved to realize a light emitting display apparatus of high luminance and ultra high resolution.

BRIEF SUMMARY

In an aspect, a light emitting display apparatus including a first substrate, a first electrode layer, a bank layer, a bank recess, a second electrode layer, and a cover layer is provided. The first electrode is positioned on the first substrate, the bank layer has an opening exposing a portion of the first electrode layer and a bank recess depressed on the bank layer, the second electrode layer is positioned on the first electrode layer and the bank layer; and the cover layer covers a lower surface and an inner side surface of the bank recess.

In another aspect, a method of manufacturing a light emitting display apparatus is provided. The method of manufacturing an organic light emitting display apparatus includes: forming a planarization layer on a first substrate; forming a first electrode layer on the planarization layer; forming a bank layer having an opening exposing a portion of the first electrode layer; forming a second electrode layer including at least one layer to cover the exposed portion of the first electrode layer and the bank layer; separating the second electrode layer into one side and the other side to expose a portion of the bank layer through the second electrode layer; etching the exposed bank layer using the second electrode layer as a mask and forming a depressed bank recess on the bank layer; and forming a cover layer covering a lower surface and an inner side surface of the bank recess.

DETAILED DESCRIPTION

Reference will now be made in detail embodiments of the disclosure examples of which are illustrated in the accompanying drawings.

Hereinafter, specific embodiments of the present disclosure will be described with reference to the accompanying drawings.

The light emitting display apparatus described hereinafter may be realized as a television, a video player, a personal computer (PC), a home theater, a smartphone, an augmented reality (AR)/virtual reality (VR) device, and the like. Hereinafter, an organic light emitting display apparatus realized on the basis of an organic light emitting diode (OLED) (light emitting device) will be described as an example. However, the light emitting display apparatus described hereinafter may also be realized on the basis of an inorganic light emitting diode.

Figure 1:
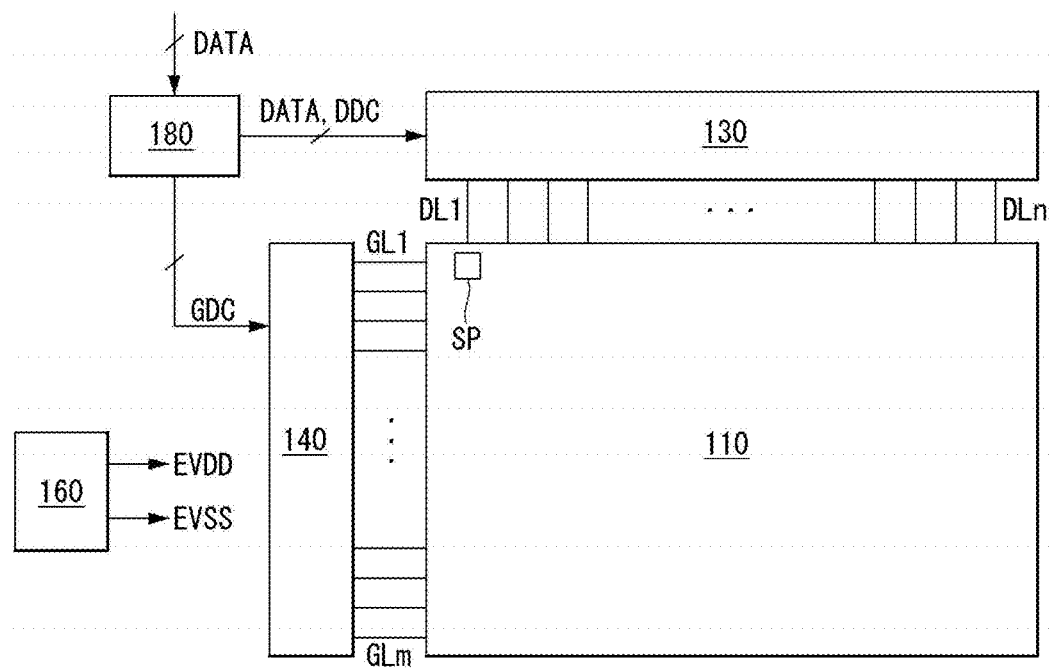
FIG. 1 is a schematic block diagram of an organic light emitting display apparatus.
Figure 2:
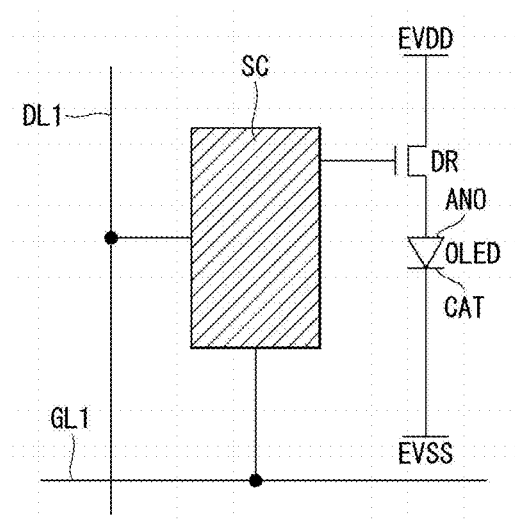
FIG. 2 is a schematic circuit diagram of a subpixel.
Figure 3:
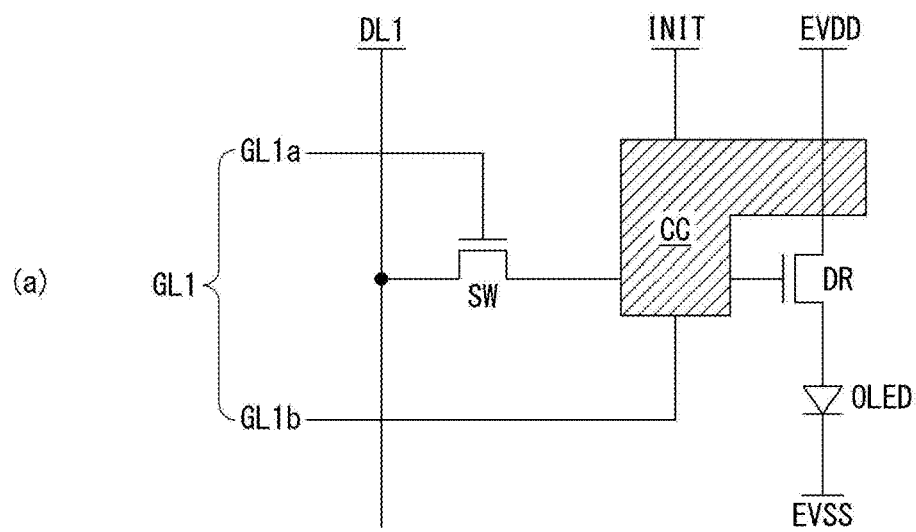
FIG. 3 is a specific circuit diagram embodying part of FIG. 2.
Figure 3:
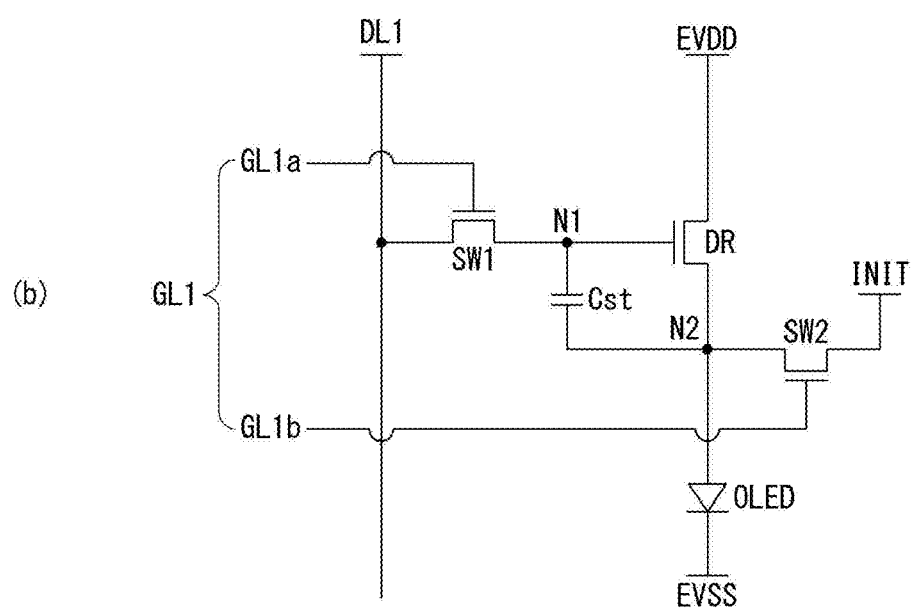
Figure 4:
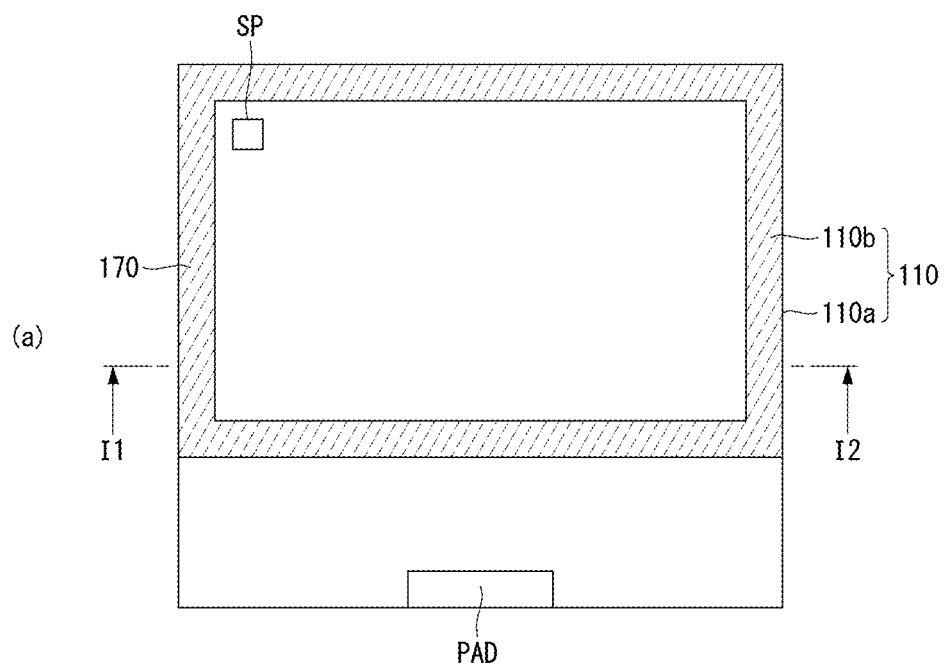
FIG. 4 is a cross-sectional view of a display panel.
Figure 4:
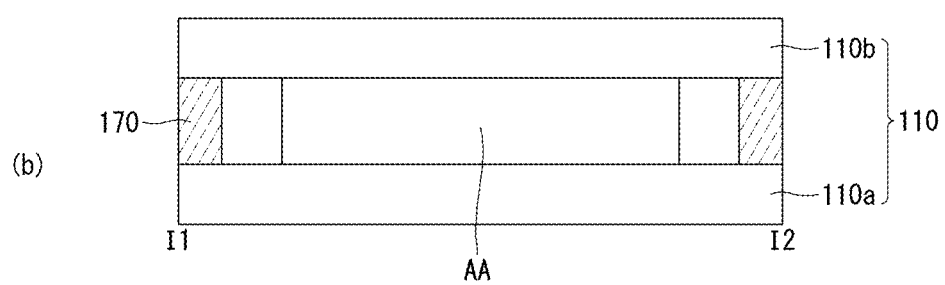
Figure 4:
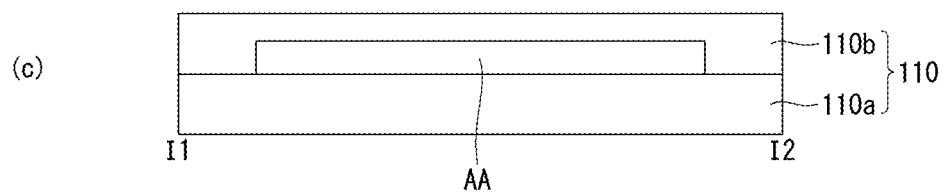
Figure 5:
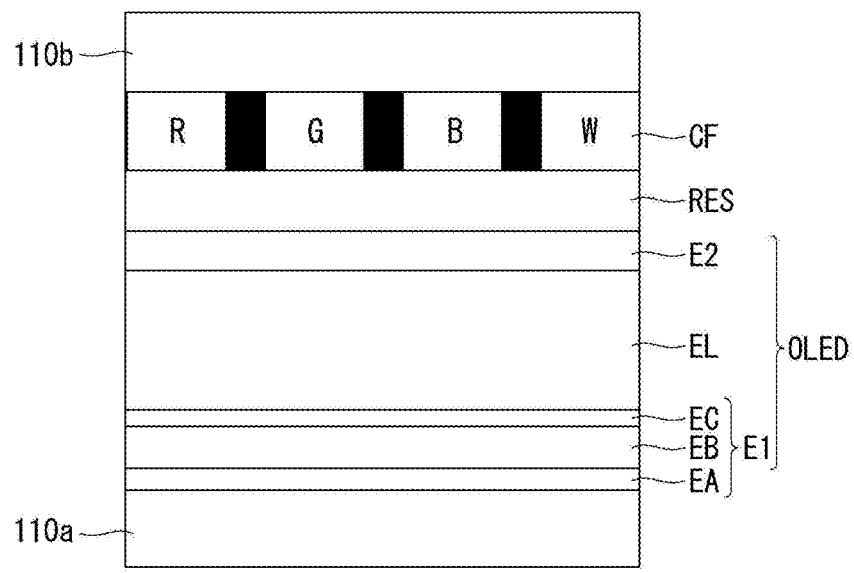
FIG. 5 is a cross-sectional view illustrating a schematic structure of subpixels.
Figure 6:
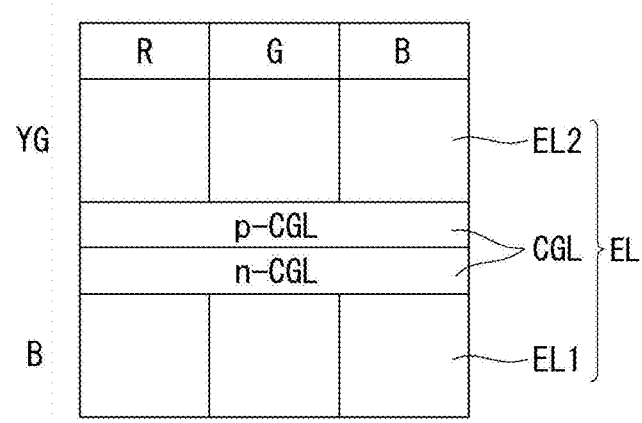
FIG. 6 is a view illustrating emission characteristics of subpixels.

FIG. 1 is a schematic block diagram of an organic light emitting display apparatus, FIG. 2 is a schematic circuit diagram of a subpixel, FIG. 3 is a specific circuit diagram embodying part of FIG. 2, FIG. 4 is a cross-sectional view of a display panel, FIG. 5 is a cross-sectional view illustrating a schematic structure of subpixels, and FIG. 6 is a view illustrating emission characteristics of subpixels.

As illustrated in FIG. 1, the organic light emitting display apparatus includes a timing controller 180, a data driver 130, a scan driver 140, a display panel 110, and a power supply unit 160.

The timing controller 180 receives a driving signal including a data enable signal, a vertical synchronization signal, a horizontal synchronization signal, a clock signal, and the like, in addition to a data signal DATA, from an image processing unit (not shown). The timing controller 180 generates a gate timing control signal GDC for controlling an operation timing of the scan driver 140 and a data timing control signal DDC for controlling an operation timing of the data driver 130 on the basis of the driving signal.

In response to data timing control signal DDC supplied from the timing controller 180, the data driver 130 samples and latches the data signal DATA supplied from the timing controller 180, converts a digital data signal into a gamma reference voltage to output an analog data signal (or a data voltage). The data driver 130 outputs the data signal DATA through the data lines DL1 to DLn. The data driver 130 may be formed as an integrated circuit (IC).

The scan driver 140 outputs a scan signal in response to the gate timing control signal GDC supplied from the timing controller 180. The scan driver 140 outputs a scan signal through scan lines GL1 to GLm. The scan driver 140 is formed as an IC or in a gate in panel (GIP) manner (a method of forming a transistor through a thin film process) on the display panel 110.

The power supply unit 160 outputs a high-potential voltage and a low-potential voltage. The high-potential voltage and low-potential voltage output from the power supply unit 160 are supplied to the display panel 110. The high-potential voltage is supplied to the display panel 110 through a first power supply line EVDD and the low-potential voltage is supplied to the display panel 110 through a second power supply line EVSS.

The display panel 110 displays an image on the basis of the data signal DATA supplied from the data driver 130, the scan signal supplied from the scan driver 140, and power supplied from the power supply unit 160. The display panel 110 includes subpixels SP which emit light and operate to display an image.

The subpixels SP include a red subpixel, a green subpixel, and a blue subpixel or a white subpixel, a red subpixel, a green subpixel, and a blue subpixel. The subpixels SP may have one or more different emission areas depending on emission characteristics.

As illustrated in FIG. 2, one subpixel is positioned at an intersection of the data line DL1 and the scan line GL1 and includes a programming unit SC to set the gate-source voltage of a driving transistor DR and an organic light emitting diode (OLED). The organic light emitting diode OLED includes an anode ANO, a cathode CAT, and an organic light emitting layer interposed between the anode ANO and the cathode CAT. The anode ANO is connected to the driving transistor DR.

The programming unit SC may be implemented with a transistor part (transistor array) including at least one switching transistor and at least one capacitor. The transistor part is implemented on the basis of a CMOS semiconductor, a PMOS semiconductor, or an NMOS semiconductor. Transistors included in the transistor part may be implemented as p-type or n-type. In addition, a semiconductor layer of the transistors included in the transistor part of the subpixel may include amorphous silicon, polysilicon, or an oxide.

The switching transistor is turned on in response to a scan signal from the scan line GL1, thus applying a data voltage from the data line DL1 to one electrode of the capacitor. The driving transistor DR controls the amount of current according to magnitudes of a voltage charged in the capacitor to adjust an emission amount of the organic light emitting diode OLED. The emission amount of the organic light emitting diode OLED is proportional to the amount of current supplied from the driving transistor DR. The subpixel is connected to the first power supply line EVDD and the second power supply line EVSS and are supplied with a high-potential voltage and a low-potential voltage from the first power supply line EVDD) and the second power supply line EVSS.

As illustrated in FIG. 3A, a subpixel may include an internal compensation circuit CC, as well as a switching transistor SW, a driving transistor DR, a capacitor Cst, and an organic light emitting diode OLED. The internal compensation circuit CC may include at least one transistor connected to a compensation signal line INIT. The internal compensation circuit CC sets the gate-source voltage of the driving transistor DR to a voltage reflecting a threshold voltage to exclude a change in luminance due to the threshold voltage of the driving transistor DR when the organic light emitting diode OLED emits light. In this case, the scan line GL1 includes at least two scan lines GL1a and GL1b to control the switching transistor SW and the transistor of the internal compensation circuit CC.

As illustrated in FIG. 3B, a subpixel includes a switching transistor SW1, a driving transistor DR, a sensing transistor SW2, a capacitor Cst, and an organic light emitting diode OLED. The sensing transistor SW2, a transistor that may be included in the internal compensation circuit CC, performs a sensing operation for compensation driving of the subpixel.

The switching transistor SW1 supplies a data voltage supplied through the data line DL1 to a first node N1 in response to a scan signal supplied through the first scan line GL1a. Also, in response to a sensing signal supplied through the second scan line GL1b, the sensing transistor SW2 serves to initialize or sense a second node N2 positioned between the driving transistor DR and the organic light emitting diode OLED.

Meanwhile, the circuit configuration of the subpixel illustrated in FIG. 3 is provided only for the sake of understanding. That is, the circuit configuration of the subpixel of the present disclosure is not limited thereto and may be variously configured as a 2T (Transistor) 1C (Capacitor), 3T1C, 4T2C, 5T2C, 6T2C, or 7T2C.

As illustrated in FIG. 4, the display panel 110 includes a first substrate 110a, a second substrate 110b, a display area AA, a pad portion PAD, a sealing member 170, and the like. As the first substrate 110a and the second substrate 110b, a transparent resin, glass, silicon or the like, allowing light to be transmitted therethrough is selected. The display area AA includes subpixels that emit light. The pad portion PAD includes pads for establishing electrical connection with an external substrate.

The display area AA is disposed to occupy almost every surface of the first substrate 110a and the pad portion PAD is disposed at an outer portion of one side of the first substrate 110a. According to the first example of part (b) of FIG. 4, the display area AA is sealed by the sealing member 170 present between the first substrate 110a and the second substrate 110b and protected from moisture or oxygen. According to the second example of part (c) of FIG. 4, the display area AA may be sealed with the first substrate 110a and second substrate 110b alone. Meanwhile, the pad portion PAD is exposed to the outside. However, a sealing structure of the display panel 110 may be variously implemented and is not limited thereto.

As illustrated in FIG. 5, the subpixels may include an organic light emitting diode OLED and a color filter layer CF. The organic light emitting diode OLED is formed on one surface of the first substrate 110a and includes an anode electrode E1 (which may also be a cathode electrode), a light emitting layer EL that emits light such as white light, or the like, and a cathode electrode E2 (which may also be an anode electrode). Light that exits from the organic light emitting diode OLED may be converted into another color by the color filter layer CF. Therefore, light that exits from the organic light emitting diode OLED should not be necessarily white, but the case where white light is emitted will be described as an example.

The color filter layer CF converts white light emitted from the light emitting layer EL into red (R), green (G), and blue (B), and exits white (W) light as is. A region which exits red light by the color filter layer CF is defined as a red subpixel, a region which exits green light is defined as a green subpixel, a region which exits blue light is defined as a blue subpixel, and a region which exits white light is defined as a white subpixel.

The color filter layer CF may be formed on the other surface of the second substrate 110a facing the light emitting diode OLED or on the light emitting diode OLED. A resin layer RES may be positioned between the cathode electrode E2 and the color filter layer CF. However, the resin layer RES may be omitted depending on a sealing structure.

The anode electrode E1 has a multilayer structure including a first electrode layer E1A, a second electrode layer E1B, and a third electrode layer E1C in order to improve light extraction characteristics toward the second substrate 110a. The first electrode layer E1A may be formed of an oxide material (e.g., ITO) having transparency, the second electrode layer E1B is formed of a metal material (e.g., Ag) having reflectivity, and the third electrode layer E1C may be formed of an oxide material (e.g., ITO) having transparency. However, the structure of the anode electrode E1 is not limited thereto.

As illustrated in FIG. 6, the light emitting layer EL may include a first light emitting layer EL1, a charge generation layer CGL, and a second light emitting layer EL2. The light emitting layer EL including the charge generation layer CGL may include two, three, or more light emitting layers, as well as the two light emitting layers EL1 and EL2. Therefore, It should be interpreted such that the light emitting layer EL including the charge generation layer CGL includes at least two light emitting layers.

The light emitting layer EL may emit white light on the basis of light emitted from the first light emitting layer EL1 and the second light emitting layer EL2. The first light emitting layer EL1 may be selectively formed of a material capable of emitting blue (B), and the second light emitting layer EL2 may be selectively formed of a material capable of emitting yellowish green YG (or yellow).

The charge generation layer CGL may be formed as a PN junction in which an N-type charge generation layer n-CGL and a P-type charge generation layer p-CGL are joined, or formed as an NP junction, the opposite to the PN junction. The charge generation layer CGL serves to generate charge or separate holes and electrons and inject charges into the layers separated into the first light emitting layer (first stack) EL1 and the second light emitting layer (second stack) EL2. The N-type charge generation layer n-CGL supplies electrons to the first light emitting layer EL1 and the P-type charge generation layer p-CGL supplies holes to the second light emitting layer EL2, whereby driving voltage may be lowered, while luminance efficiency of the device including the plurality of light emitting layers is further increased.

The N-type charge generation layer n-CGL may be formed of a metal or an organic material doped an N-type. The metal may be a material selected from the group consisting of Li, Na, K, Rb, Cs, Mg, Ca, Sr, Ba, La, Ce, Sm, Eu, Tb, Dy, and Yb. In addition, the N type dopant used in the N type-doped organic material and a material of a host may be commonly used materials. For example, the N-type dopant may be an alkaline metal, an alkaline metal compound, an alkaline earth metal, or an alkaline earth metal compound. The N-type dopant may be selected from the group consisting of Cs, K, Rb, Mg, Na, Ca, Sr, Eu, and Yb. In addition, the host may be a material selected from the group consisting of tris(8-hydroxyquinoline) aluminum, triazine, hydroxyquinoline derivatives, benzazole derivatives, and silole derivatives.

The P-type charge generation layer p-CGL may be formed of a metal or a P-type-doped organic material. The metal may be formed of one or more alloys selected from the group consisting of Al, Cu, Fe, Pb, Zn, Au, Pt, W, In, Mo, Ni, and Ti. The P-type dopant used for the organic material doped with P-type and a material of a host may be conventionally used materials. For example, the P-type dopant may be a material selected from the group consisting of 2,3,5,6-tetrafluoro-7,7,8,8-tetracyanoquinodimethane (F4-TCNQ), derivatives of tetracyanoquinodimethane, iodine, $FeCl_3$, $FeF_3$, and $SbCl_5$. In addition, the host may be a material selected from the group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The organic light emitting display apparatus, which displays an image on the basis of light generated by the LED included in the subpixel, has various advantages as it comes to prominence as a next-generation display apparatus. However, there is a problem yet to be solved to manufacture an organic light emitting display apparatus capable of realizing ultra high resolution, while supporting high luminance. Hereinafter, an experimental example will be adopted and an embodiment for improving the experimental example to an organic light emitting display apparatus capable of realizing high luminance and ultra high resolution will be described.

Experimental Example

Figure 7:
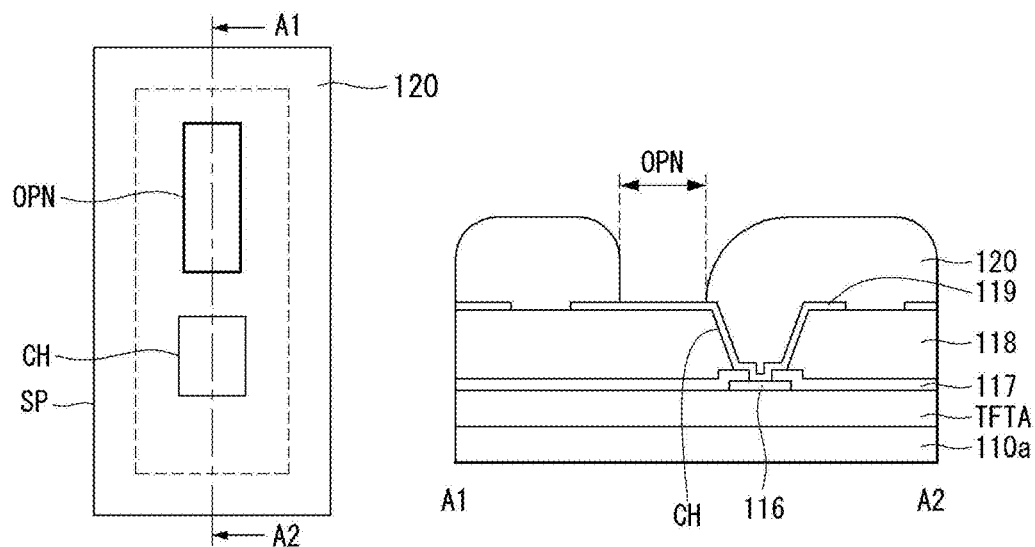
FIG. 7 shows a plan view and a cross-sectional view of a subpixel of an organic light emitting display apparatus according to an experimental example.
Figure 8:
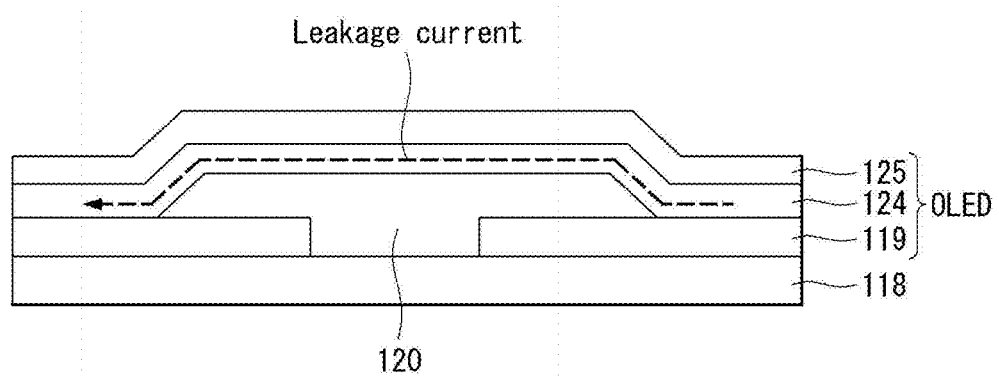
FIG. 8 is a cross-sectional view of a subpixel to explain a problem of the experimental example.

FIG. 7 shows a plan view and a cross-sectional view of a subpixel of an organic light emitting display apparatus according to an experimental example, and FIG. 8 is a cross-sectional view of a subpixel to explain a problem of the experimental example.

As illustrated in FIG. 7, the organic light emitting display apparatus according to the experimental example has a structure in which a contact hole CH and an opening OPN included in a subpixel SP are separately disposed.

The contact hole CH is a portion where a source or drain electrode 116 of a transistor part TFTA and a first electrode layer 119 are in contact (electrically connected). The illustrated transistor part TFTA corresponds to a driving transistor driving an OLED and the source or drain electrode 116 corresponds to a source electrode or a drain electrode of the driving transistor.

The first electrode layer 119 is positioned on a planarization layer 118 covering a protective layer 117 of the transistor part TFTA. The first electrode layer 119 is electrically connected to the source or drain electrode 116 of the transistor part TFTA. The first electrode layer 119 is divided into a portion positioned in the contact hole CH of the planarization layer 118 (or a portion in contact with the electrode) and a portion positioned on an upper surface of the planarization layer 118 (or a portion positioned in a light emitting region).

A bank layer 120 is positioned on the planarization layer 118. The bank layer 120 covers a portion of the first electrode layer 119. The bank layer 120 is also positioned inside the contact hole CH. That is, the bank layer 120 positioned inside the contact hole CH serves as a filling layer filling a recessed space of the contact hole CH. The bank layer 120 has an opening OPN exposing the first electrode layer 119. The opening OPN provided in the bank layer 120 defines a size (width) of a light emitting region of the subpixel.

The bank layer 120 is positioned between a subpixel and a subpixel. The portion where the bank layer 120 is positioned corresponds to a non-light emitting region. In the bank layer 120, a portion adjacent to the opening OPN has a slope. A cross-section of an outer side of the bank layer 120 may have a regular tapered shape or may have a hemispherical shape, an elliptical shape, or a mountain shape having a sloped outer surface and a flat upper surface, depending on the width of the bank layer or the shape of the tapered outer surface of the bank layer.

As illustrated in FIG. 8, a light emitting layer 124 and a common electrode layer 125 are further formed on the first electrode layer 119. The light emitting layer 124 is formed to cover the outer surface and the upper surface of the bank layer 120 and the first electrode layer 119 exposed through the opening OPN. The common electrode layer 125 is formed along a stacked shape of the light emitting layer 124.

As can be known from the above description, in the experimental example, since the contact hole CH for electrically connecting the source or drain electrode 116 of the transistor part TFTA and the first electrode layer 119 of the organic light emitting diode is present, a region occupied by the opening OPN is limited.

Also, in the experimental example, due to the occurrence of lateral current leakage (See "leakage current" path of FIG. 8) through a charge generation layer included in the light emitting layer 124 of the OLED, an emission defect may be caused between adjacent subpixels. Therefore, in order to realize an organic light emitting display apparatus having high luminance and ultra-high resolution, the problem described above, and the like, must be improved.

First Embodiment

Figure 9:
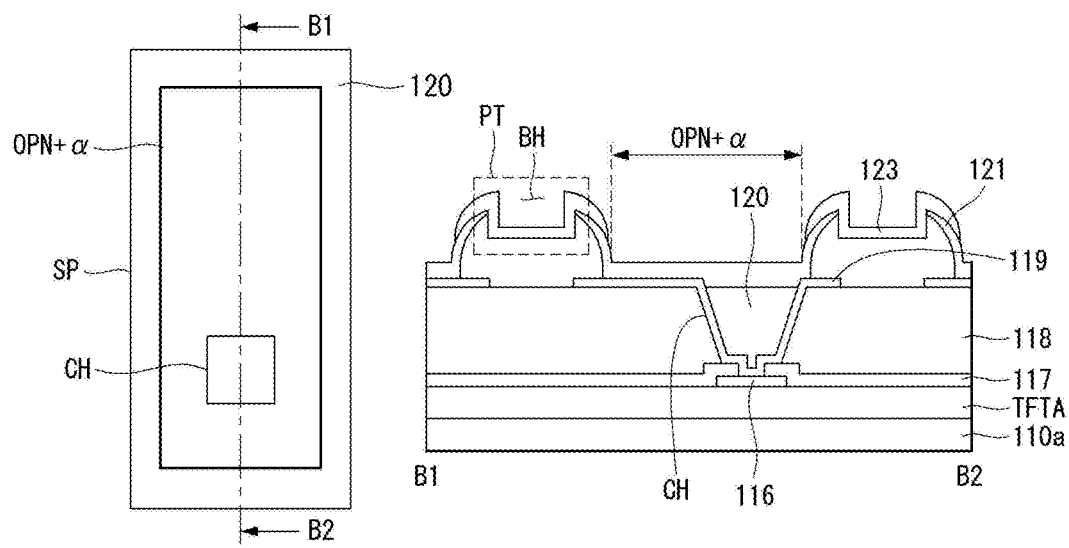
FIG. 9 is a plan view and a cross-sectional view of a subpixel of an organic light emitting display apparatus according to a first embodiment of the present disclosure.
Figure 10:
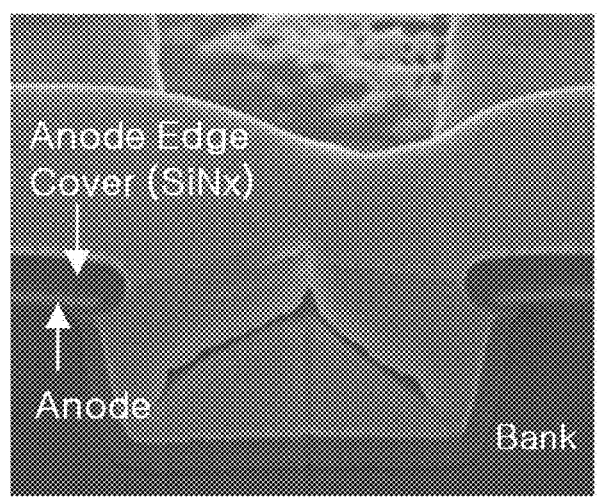
FIGS. 10 and 11 are photographs of experimenting a function of a bank recess and a cover layer according to a first embodiment of the present disclosure.
Figure 11:
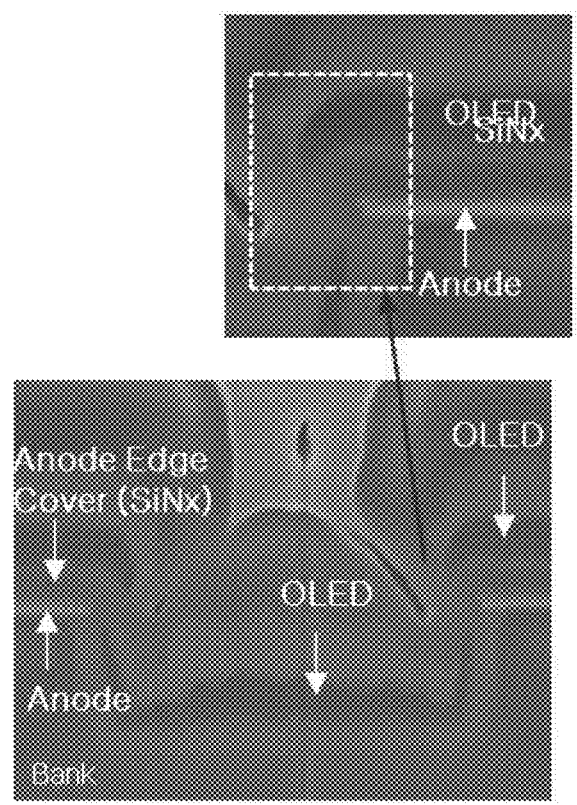

FIG. 9 shows a plan view and a cross-sectional view of a subpixel of an organic light emitting display apparatus according to a first embodiment of the present disclosure, and FIGS. 10 and 11 are photographs of experimenting a function of a bank recess and a cover layer according to a first embodiment of the present disclosure.

As illustrated in FIGS. 9 to 11, in the organic light emitting display apparatus according to the first embodiment, a contact hole CH is disposed in an opening OPN included in a subpixel SP.

The contact hole CH is a portion where a source or drain electrode 116 of a transistor part TFTA and a first electrode layer 119 are in contact (electrically connected). The illustrated transistor part TFTA corresponds to a driving transistor driving an OLED and the source or drain electrode 116 corresponds to a source electrode or a drain electrode of the driving transistor.

The first electrode layer 119 is positioned on a planarization layer 118 covering a protective layer 117 of the transistor part TFTA. The first electrode layer 119 is electrically connected to the source or drain electrode 116 of the transistor part TFTA. The first electrode layer 119 is divided into a portion positioned in the contact hole CH of the planarization layer 118 (or a portion in contact with the electrode) and a portion positioned on an upper surface of the planarization layer 118 (or a portion positioned in a light emitting region).

The bank layer 120 is positioned on the planarization layer 118. The bank layer 120 covers a part of the first electrode layer 119. The bank layer 120 is also positioned inside the contact hole CH. The bank layer 120 positioned inside the contact hole CH may have the same surface height as the first electrode layer 119. The bank layer 120 has an opening OPN exposing the first electrode layer 119. The opening OPN provided in the bank layer 120 defines a size (width) of the light emitting region of the subpixel. The opening OPN may be defined "OPN+α" as the size of the opening OPN increases greatly as it further includes the contact hole CH.

The bank layer 120 is positioned between a subpixel and a subpixel. The portion where the bank layer 120 is positioned corresponds to a non-light emitting region. In the bank layer 120, a portion adjacent to the opening OPN has a slope. A cross-section of the bank layer 120 may have a regular tapered shape or may have a hemispherical shape, an elliptical shape, or a mountain shape having a sloped outer surface and a flat upper surface, depending on the width of the bank layer or the shape of the tapered outer surface of the bank layer.

The bank layer 120 has a bank recess BH in which an upper surface is recessed. Although it is illustrated that the bank recess BH include a lower surface and an inner surface and have a rectangular cross-section, the bank recess BH may have a triangular, trapezoidal, polygonal, and elliptically long in the horizontal direction, but is not limited thereto. The bank recess BH provided at the upper surface of the bank layer 120 serve to separate the light emitting layer 124 into one side and the other side such that the light emitting layer 124 is not connected between the subpixels. The bank recess BH is positioned between the subpixels and provides a space for separating the light emitting layer 124 into one side and the other side.

The second electrode layer 121 is positioned on the first electrode layer 119 and the bank layer 120. The second electrode layer 121 is positioned inside the opening OPN and on the upper surface and the inner surface of the bank layer 120. The second electrode layer 121 positioned inside the opening OPN is electrically connected to the first electrode layer 119. However, the second electrode layer 121 positioned on the outer surface of the bank layer 120 is divided into one side and the other side with respect to the bank recess BH. That is, like the light emitting layer 124, the second electrode layer 121 is separated by the bank recess BH in each the subpixel. The second electrode layer 121 may be selected as a single layer as shown or may be selected as a multi-layer including at least two layers.

The cover layer 123 is positioned on the bank layer 120. The cover layer 123 covers both the lower surface and the inner surface of the bank recess BH. The cover layer 123 covers a portion of the end of the second electrode layer 121 existing on the outer surface of the bank layer 120. The cover layer 123 serves to completely separate regions of the second electrode layer 121 and prevent a short circuit that may occur between a common electrode layer formed thereafter and the second electrode layer 121.

FIG. 10 is a photograph of a portion corresponding to the "PT" region in FIG. 9, illustrating the bank layer 120 (see BNK in the photograph) having a bank recess, a cover layer 123 (See anode edge cover in the photograph), and the second electrode layer 121 (See anode in the photograph) based on the first embodiment, and FIG. 11 is a photograph illustrating the light emitting layer 124 (See OLED in the photograph) formed based on the structure of FIG. 10.

As illustrated in the photographs showing experimental results of FIGS. 10 and 11, when the structure as that of the first embodiment is used, the light emitting layer may be divided into a portion positioned on the lower surface of the bank recess and a portion positioned on the upper surface of the bank layer (which may also be positioned on the outer surface of the bank layer, although not shown).

Experimental results indicate that when the organic light emitting diode is formed on the basis of the structure as in the first embodiment, a current leakage problem of the light emitting diode (in particular, a current leakage occurring in the structure in which the charge generation layer exists) is resolved. As a result, the structure as in the first embodiment prevents or improves the problem that, for example, both a red subpixel and a green subpixel simultaneously emit light even though the green or red subpixel is controlled to emit light, or one or more of blue, red, and green subpixels simultaneously emit light even though the blue subpixel is controlled to emit light.

Figure 17:
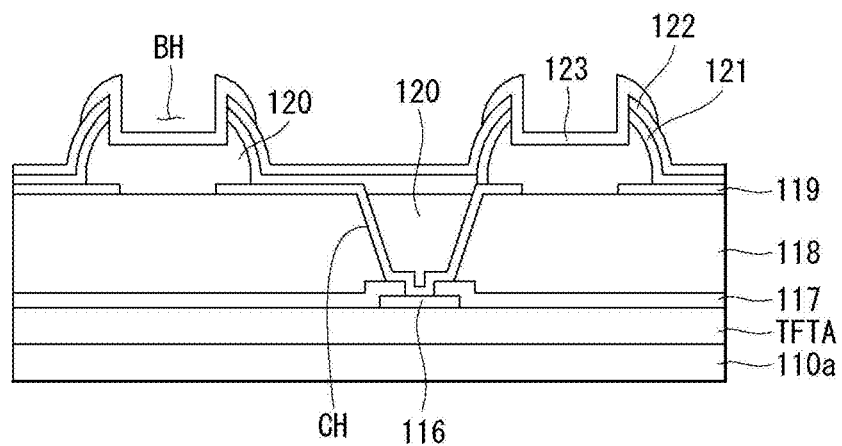
Figure 18:
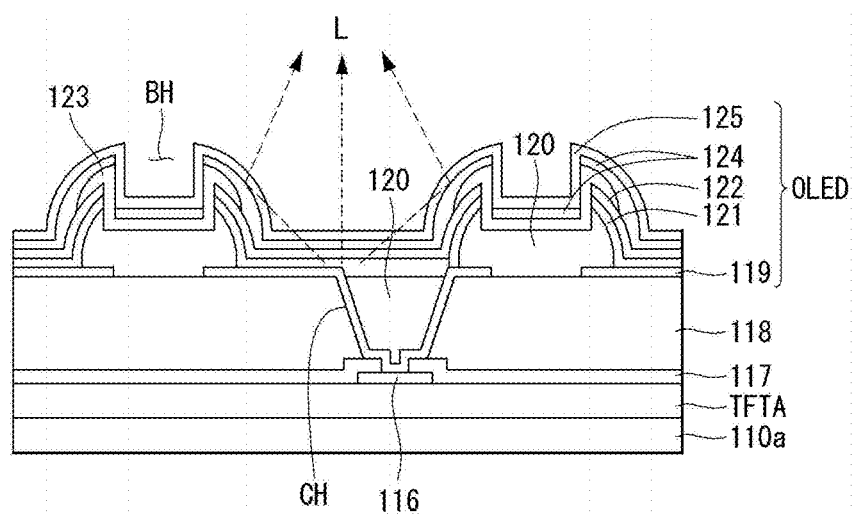
Figure 19:
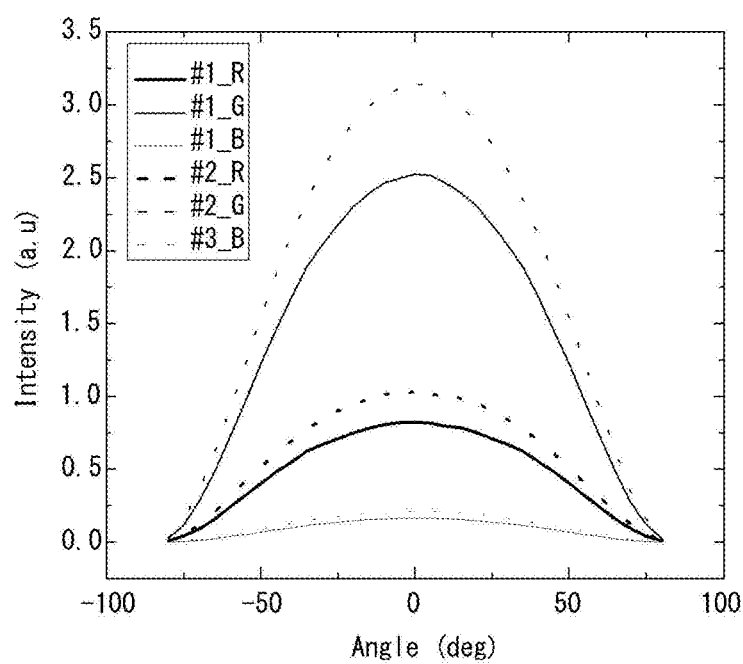
FIGS. 19 and 20 illustrate simulation results of an experiment on strength (efficiency) and a color viewing angle of an organic light emitting display apparatus manufactured on the basis of the first embodiment of the present disclosure.
Figure 20:
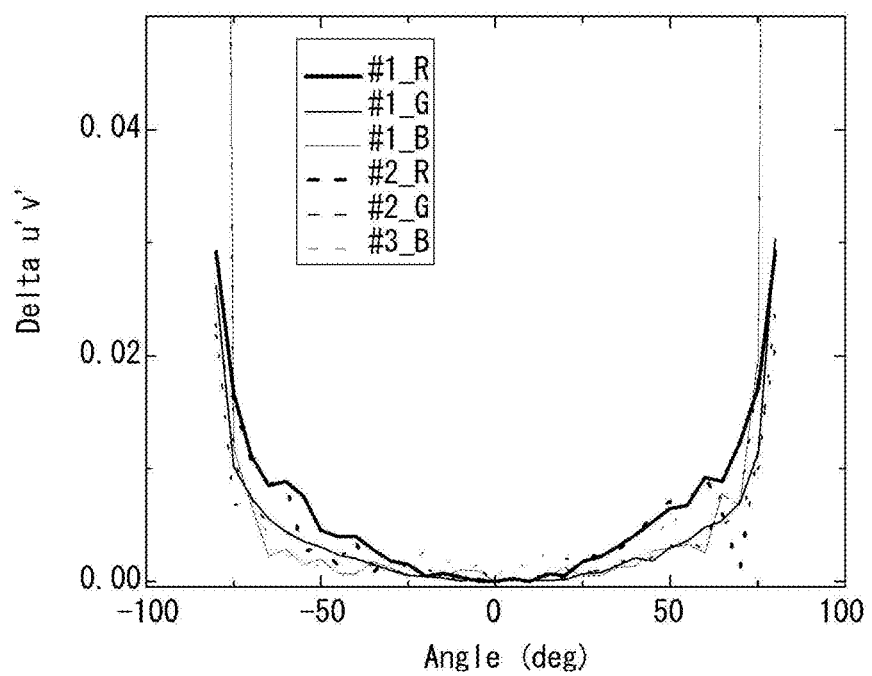

FIGS. 12 to 18 are cross-sectional views sequentially illustrating a process of a method of manufacturing an organic light emitting display apparatus according to a first embodiment of the present disclosure, and FIGS. 19 and 20 illustrate simulation results of an experiment on intensity (efficiency) and a color viewing angle of an organic light emitting display apparatus manufactured on the basis of the first embodiment of the present disclosure.

Figure 12:
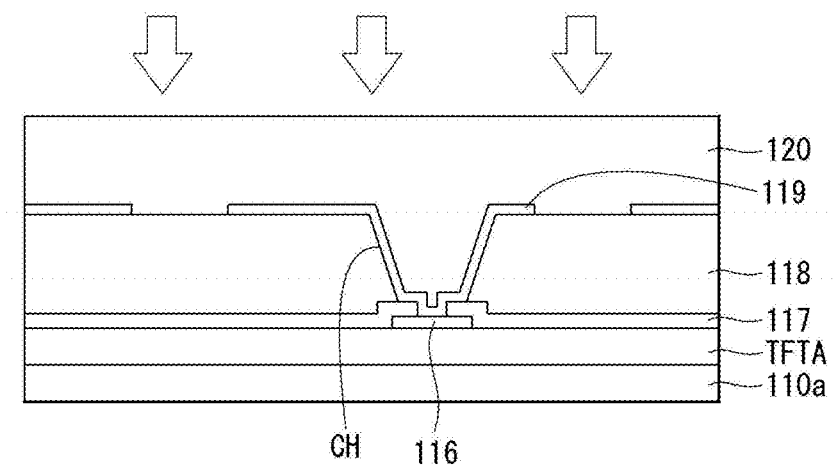
FIGS. 12 to 18 are cross-sectional views sequentially illustrating a process of a method of manufacturing an organic light emitting display apparatus according to a first embodiment of the present disclosure.

As illustrated in FIG. 12, a transistor part TFTA including a transistor having a gate electrode, a source electrode, and a drain electrode is formed on a first substrate 110a. On the first substrate 150a, a passivation layer 117 covering the transistor part TFTA is formed. The passivation layer 117 may be selected as an inorganic material such as silicon nitride (SiNx), silicon oxide ($SiO_2$), photoacrylate, photoresist (PR), or the like, but is not limited thereto.

A planarization layer 118 covering the passivation layer 117 is formed on the first substrate 110a. The planarization layer 118 may be formed of an organic material such as an overcoat layer, a polyimide, a benzocyclobutene-based resin, acrylate, or photoacrylate, and the like, but is not limited thereto. The passivation layer 117 and the planarization layer 118 are patterned to expose the source or drain electrode 116 of the transistor part TFTA. A portion of the planarization layer 118 that exposes the source or drain electrode 116 of the transistor part TFTA is a contact hole CH. The contact hole CH may have various shapes such as a circle, an ellipse, and a square.

A first electrode layer 119 is formed on the planarization layer 118. The first electrode layer 119 may be selected from transparent oxide materials such as ITO, ITZO, ITO/Ag/ITO, and the like, but is not limited thereto. A bank layer 120 is formed on the planarization layer 118. The bank layer 120 may be formed of an organic material such as an overcoat layer, a polyimide, a benzocyclobutene-based resin, acrylate, photoacrylate, or the like, but is not limited thereto. Since the bank layer 120 is selectively formed of as an organic material, the bank layer 120 is formed to have a predetermined thickness on the planarization layer 118, while filling the contact hole CH. Exposing is performed on the first substrate 110a to form the shape of the bank layer 120.

Figure 13:
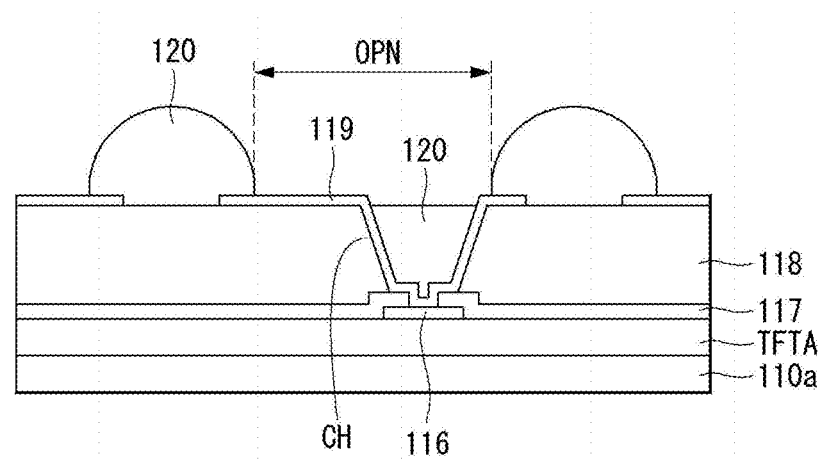

As illustrated in FIG. 13, after exposing is completed, developing and curing are performed on the first substrate 110a. By this process, the bank layer 120 having the opening OPN is formed on the planarization layer 118. The inside of the contact CH is filled with the bank layer 120. Here, the bank layer 120 filling the inside of the contact hole CH has a height similar to or the same as that of the first electrode layer 119.

Figure 14:
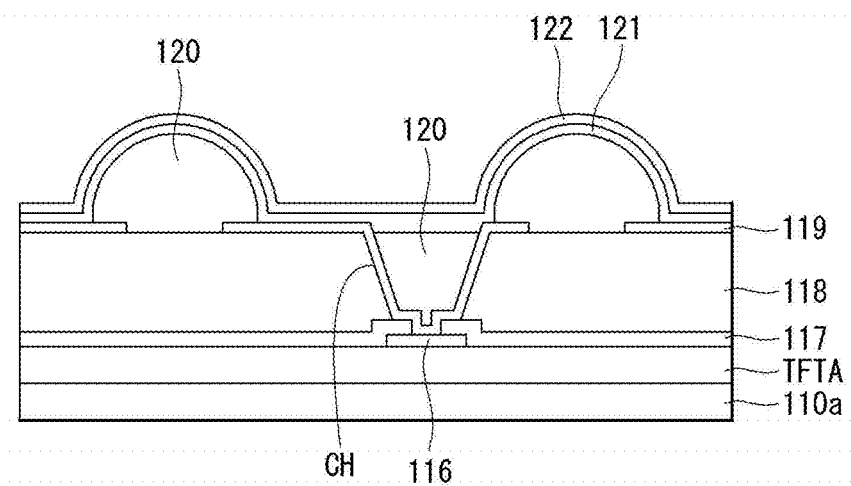

As illustrated in FIG. 14, second and third electrode layers 121 and 122 are formed on the first electrode layer 119 and the bank layer 120 exposed in the opening OPN. The second electrode layer 121 may be selectively formed of a reflective material such as silver (Ag), and the third electrode layer 122 may be selectively formed of a transparent oxide material such as ITO, ITZO, ITO/Ag/ITO, and the like, but is not limited thereto.

An example is illustrated in which the first electrode layer 119 of a single layer is formed based on a first electrode process and second and third electrode layers 121 and 122 having a multi-layer structure are formed based on a second electrode process. However, a single electrode layer may be formed in both the first and second electrode processes. In this case, the electrode layer has a total two-layer structure, but it may also have three or more layers.

The second and third electrode layers 121 and 122 are positioned inside the opening OPN and on the upper surface and the outer surface of the bank layer 120, respectively. The second and third electrode layers 121 and 122 positioned inside the opening OPN are electrically connected to the first electrode layer 119. The second and third electrode layers 121 and 122 positioned on the upper surface and the outer surface of the bank layer 120 among the second and third electrode layers 121 and 122 reflect light emitted from the light emitting layer 124 and concentrate on the central portion of the opening OPN to improve light extraction efficiency.

Due to this structure, light extraction efficiency of light extracted from the light emitting layer 124, that is, outcoupling, is improved. In addition, since light generated from the light emitting layer 124 also exits from the upper surface and the outer surface of the bank layer 120, which is a part for improving the outcoupling, an effect of increasing an aspect ratio, and thus, the opening OPN may be re-defined as "OPN+α+β".

In addition, the bank layer 120 may have a hemispherical shape, an elliptical shape, or the like, to enhance the light concentration ability based on the second and third electrode layers 121 and 122. Also, at least one of the second and third electrode layers 121 and 122 may be selectively formed of as a material capable of improving reflectivity and concentration ability.

Figure 15:
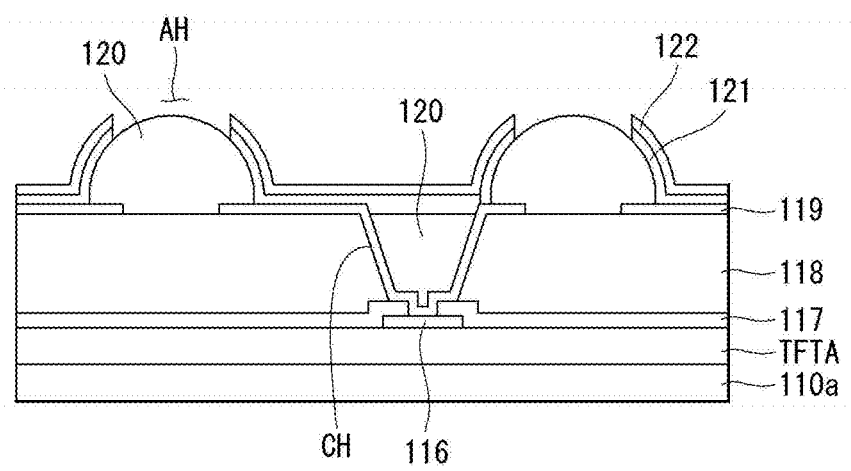

As illustrated in FIG. 15, wet etching is performed on a partial region of the second and third electrode layers 121 and 122. Wet etching is selectively performed on all the second and third electrode layers 121 and 122 positioned on the upper surface of the bank layer 120. Due to the etching process, the second and third electrode layers 121 and 122 positioned on the upper surface of the bank layer 120 are removed, and a separating portion AH exposing an upper surface of the bank layer 120 present therebelow is present. As a result, the second and third electrode layers 121 and 122 expose the upper surface of the bank layer 120 and are separated into one side and the other side. That is, the second and third electrode layers 121 and 122 are separated in units of subpixels.

Figure 16:
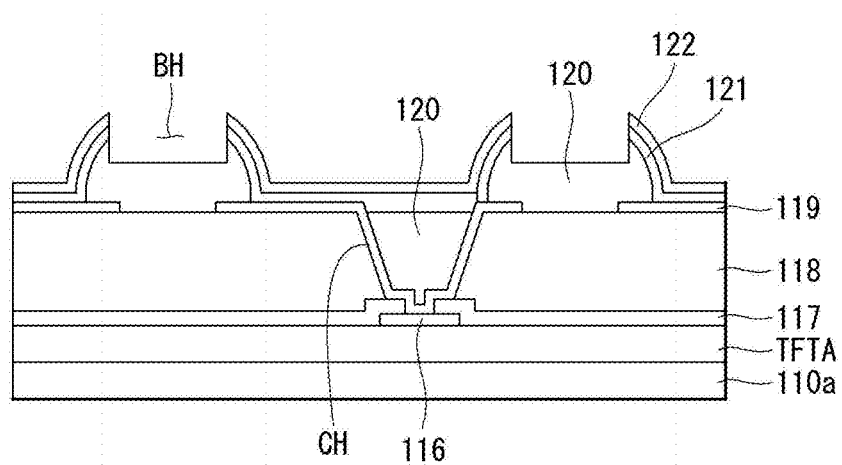

As illustrated in FIG. 16, dry etching is performed on a partial region of the bank layer 120. The dry etching is performed on the upper surface of the bank layer 120, that is, all the regions where the separating portion AH is positioned, and since etching is performed based on the second and third electrode layers 121 and 122 having the separating portion AH (the second and third electrode layers 121 and 122 are used as masks), a mask is not used (the increase in the number of masks is prevented). Due to the etching process, a bank recess BH depressed from the upper surface is formed.

As illustrated in FIG. 17, a cover layer 123 is formed on the bank layer 120. The cover layer 123 covers a lower surface and an inner surface of the bank recess BH. The cover layer 123 covers portions of the ends of the second and third electrode layers 121 and 122 existing on the outer surface of the bank layer 120.

The cover layer 123 serves to completely separate the second and third electrode layers 121 and 122 and prevent a short circuit that may occur between the common electrode layer (to be formed later) and the second and third electrode layers 121 and 122. The cover layer 123 may be selectively formed of inorganic materials such as silicon nitride (SiNx), silicon oxide ($SiO_2$), photoacrylate, photoresist (PR), and the like, but is not limited thereto.

As illustrated in FIG. 18, a light emitting layer 124 is formed on the second and third electrode layers 121 and 122. The light emitting layer 124 may have at least two light emitting layers including one light emitting layer or a charge generation layer. The light emitting layer 124 is separated into a portion positioned on the second and third electrode layers 121 and 122 and a portion positioned on the lower surface of the bank recess BH. That is, the light emitting layer 124 is also divided in units of subpixels. Due to this structure, the problem that a light emission defect occurring between adjacent subpixels is solved. In addition, since the light emitting layer 124 is formed to occupy a wide opening OPN including the contact hole CH, luminance may be enhanced due to the increase in the light emitting region and life is also enhanced.

A common electrode layer 125 is positioned on the light emitting layer 124. The common electrode layer 125 is selectively formed of a material allowing light to be transmitted therethrough. The common electrode layer 125 is positioned on the second and third electrode layers 121 and 122, the light emitting layer 124, and the light emitting layer 124 positioned on the lower surface of the bank recess BH. That is, the common electrode layer 125 is positioned on all the subpixels.

As illustrated in FIGS. 19 and 20, it can be seen that the first embodiment (See #2) may improve a color viewing angle as well as the intensity (efficiency), compared with experimental example (See #1). The experimental example (See #1) is the experimental result of a display panel manufactured on the basis of the structure of FIG. 7, and the first embodiment (See #2) is the experimental result of a display panel manufactured on the basis of the structure of FIG. 9.

As described above, the first embodiment of the present disclosure has an effect of realizing an organic light emitting display apparatus having high luminance and ultra-high resolution. In addition, the first embodiment has an effect of realizing an organic light emitting display apparatus capable of solving the problem of defective light emission between adjacent subpixels due to current leakage. In addition, since the first embodiment has the wide opening including the contact hole, the first embodiment realizes an organic light emitting display apparatus capable of achieving high luminance and ultra-high resolution due to an increase in the light emitting area, as well as long life. In addition, the first embodiment has an effect of realizing an organic light emitting display apparatus capable of improving outcoupling of extracted light by a light emitting and light concentrating function on the side of the bank layer.

Second Embodiment

Figure 21:
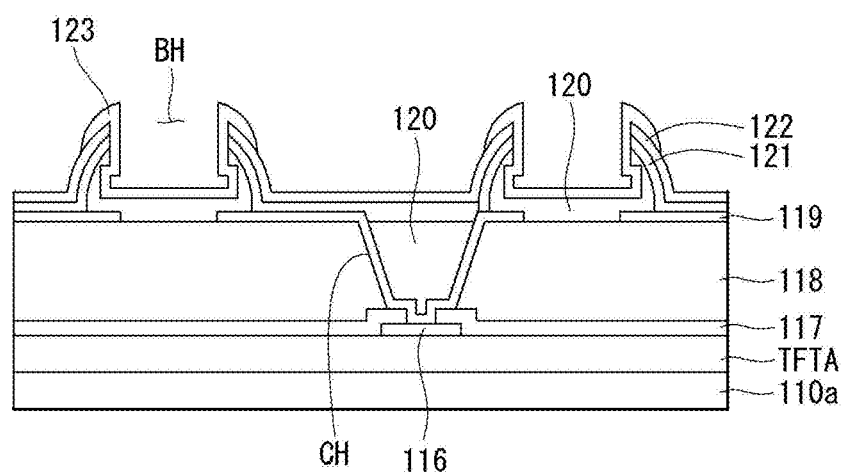
FIG. 21 is a cross-sectional view illustrating a portion of a subpixel of an organic light emitting display apparatus according to a second embodiment of the present disclosure.
Figure 25:
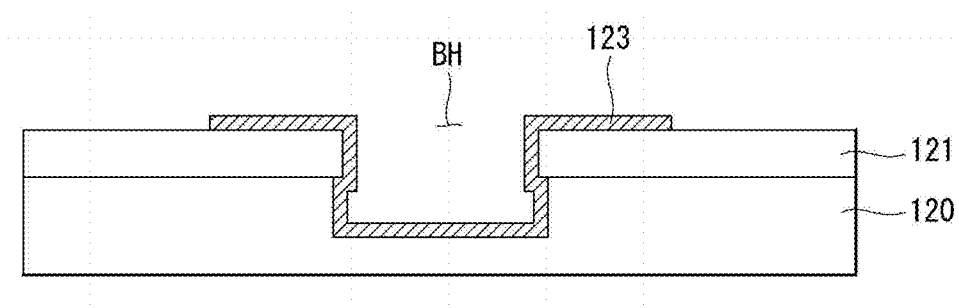
Figure 26:
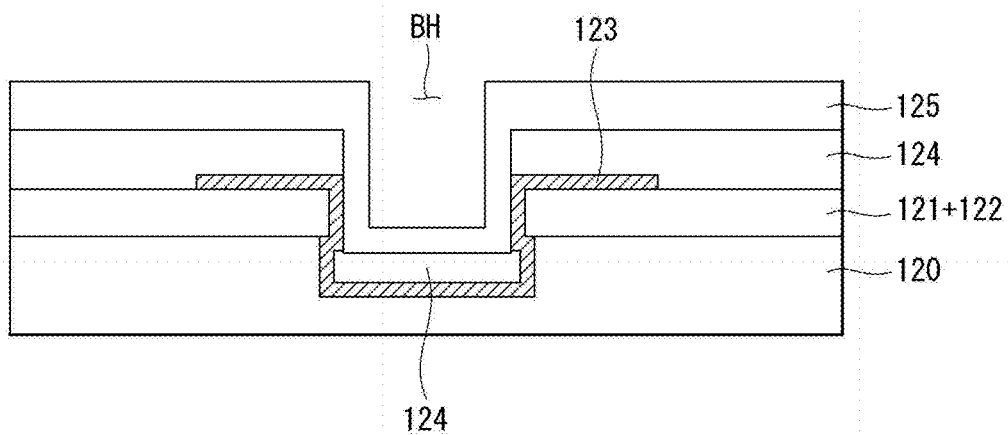
Figure 27:
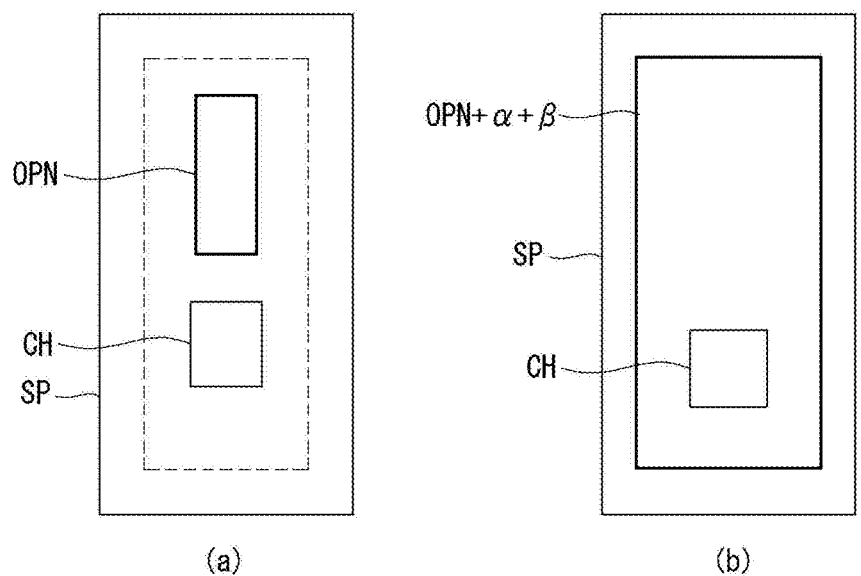
FIG. 27 is a plan view illustrating a comparison between a subpixel according to an experimental example and a subpixel according to a second embodiment of the present disclosure.

FIG. 21 is a cross-sectional view illustrating a portion of a subpixel of an organic light emitting display apparatus according to a second embodiment of the present disclosure, FIGS. 22 to 26 are cross-sectional views sequentially illustrating a process of a method of manufacturing an organic light emitting display apparatus according to the second embodiment of the present disclosure, and FIG. 27 is a plan view illustrating a comparison between a subpixel according to an experimental example and a subpixel according to a second embodiment of the present disclosure.

As illustrated in FIG. 21, in the organic light emitting display according to the second embodiment, a contact hole CH is disposed in an opening OPN included in a subpixel SP as in the first embodiment. However, the second embodiment differs from the first embodiment in the shape of the bank recess BH provided in the bank layer 120 and the shape of layers stacked thereafter due to the shape of the bank recess BH, and therefore, the difference will be largely described. Also, in the drawing, the upper surface of the bank layer 120 is flat, but this is only an example.

The bank recess BH includes a lower surface and an inner side surface. In particular, the inner side portion of the bank recess BH includes a lower portion inwardly protruded to further expose the lower surface of the bank hole BH and an outwardly protruded upper portion which is opposite to the inner portion. The cross-section of the bank recess BH may be defined as "T rotated by 180 degrees", but the shape of the cross-section may vary depending on a height and material of the bank layer 120, an etchant, an etching method, and the like.

However, as described above, the bank recess BH preferably has a structure in which the lower space in the inner side portion of the bank recess BH is further protruded. Since the bank recess BH has such a shape, the cover layer 123 to be formed later is also formed to correspond to the shape of the bank recess BH, and thus, the cover layer 123 includes the lower portion inwardly protruded and an outwardly protruded upper portion opposite to the inner portion.

If the bank recess BH provided in the bank layer 120 have such a shape, the function of separating the light emitting layer 124 without being connected between subpixels may be further improved. The reason for this is that, since the inner side portion of the bank recess BH, in particular, the lower portion, is inwardly protruded, a separation space to converge it although there is a change in the thickness of the light emitting layer 124 is provided.

Hereinafter, a method of manufacturing the bank layer 120 having the bank recess BH as in the second embodiment and the organic light emitting diode using the same will be described briefly.

Figure 22:
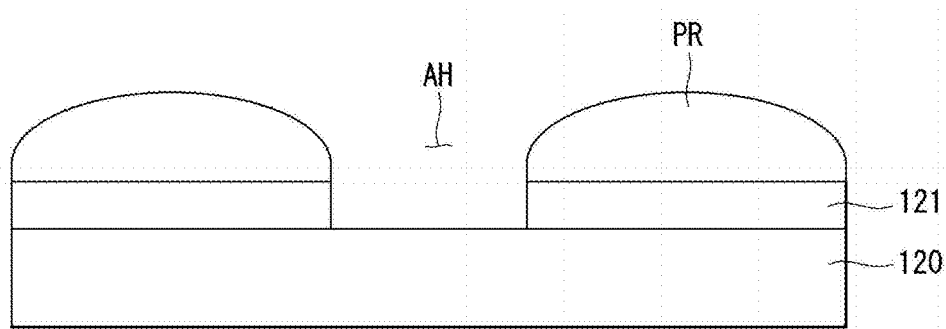
FIGS. 22 to 26 are cross-sectional views sequentially illustrating a process of a method of manufacturing an organic light emitting display apparatus according to the second embodiment of the present disclosure.

As illustrated in FIG. 22, the second electrode layer 121 and photoresist PR are formed on the bank layer 120 and wet-etched. Accordingly, the second electrode layer 121 and the photoresist PR have a separating portion AH exposing the upper surface of the bank layer 120, and are separated into one side and the other side.

Figure 23:
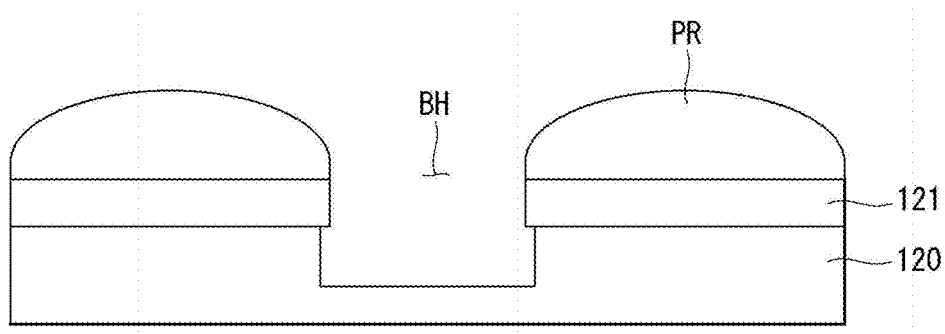
Figure 24:
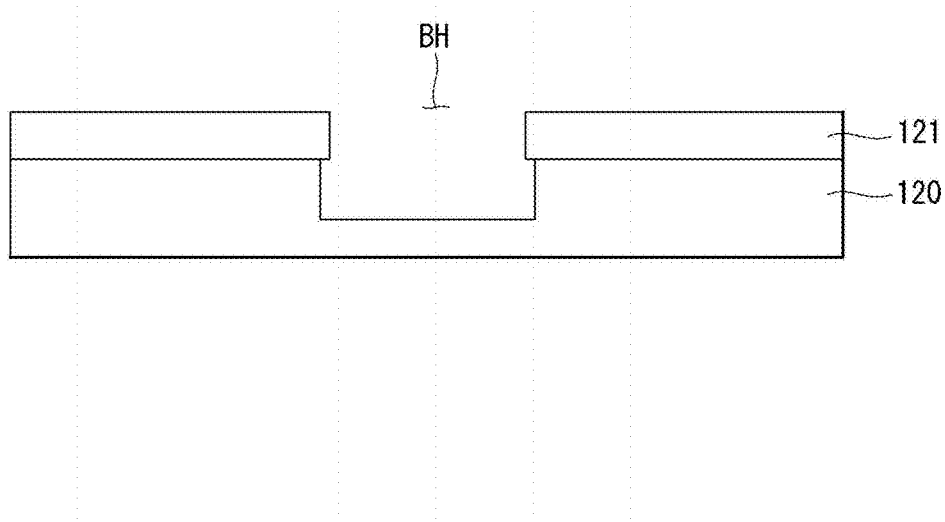

As illustrated in FIGS. 23 and 24, the bank layer 120 exposed inside the separating portion AH is subjected to dry etching or an undercut process, and the photoresist PR is removed. Accordingly, the exposed bank layer 120 is formed with the bank recess BH inwardly protruded in the lower portion than the upper portion. As described above, the cross-section of the bank recess BH may be defined as "T rotated by 180 degrees", but the shape of the cross-section may vary depending on the height and material of the bank layer 120, an etchant, an etching method, and the like.

As illustrated in FIGS. 25 and 26, the cover layer 123 is formed on the bank layer 120 and the second electrode layer 121 and dry-etched so that only the bank recess BH remains. Thereafter, the light emitting layer 124 and the common electrode layer 125 are formed to complete the organic light emitting diode (OLED). Here, the organic light emitting diode OLED may further include a third electrode layer 122 in addition to the second electrode layer 121.

FIG. 27 illustrates an example of a result of a comparison of planes of subpixels manufactured according to experimental example and second embodiment. The total size of one subpixel was set to 100, which is defined as a reference subpixel. Thereafter, an opening of experimental example (a) and an opening of second embodiment (b) were compared with reference subpixels as follows.

The opening of experimental example (a) was measured to have an aperture ratio of approximately 10.6% in the overall size of a reference subpixel. Meanwhile, the opening of the second embodiment (b) was measured to have an aperture ratio of approximately 59.99% in the overall size of the reference subpixel. The same result was obtained in the first embodiment.

Third Embodiment

Figure 28:
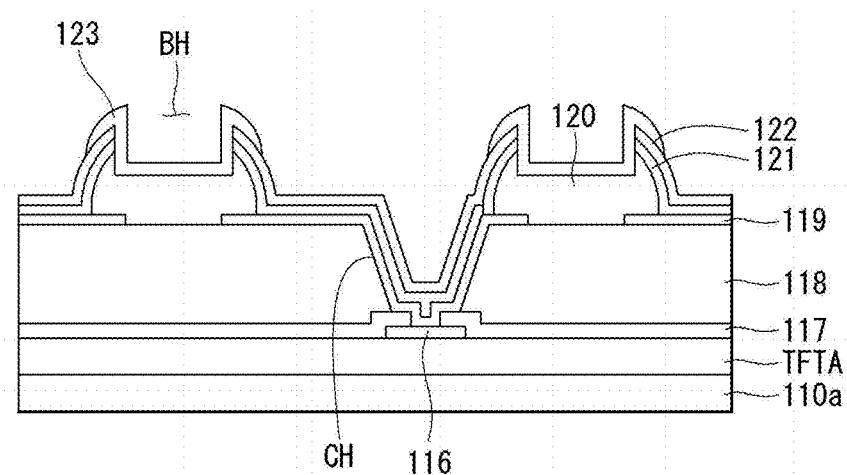
FIG. 28 is a cross-sectional view illustrating a portion of a subpixel of an organic light emitting display apparatus according to a third embodiment of the present disclosure.

FIG. 28 is a cross-sectional view illustrating a portion of a subpixel of an organic light emitting display according to a third embodiment of the present disclosure.

As illustrated in FIG. 28, the organic light emitting display according to the third embodiment includes a contact hole CH in an opening OPN included in a subpixel SP, as in the first embodiment or the second embodiment. However, the third embodiment differs from the first embodiment or the second embodiment in that the inside of the contact hole CH is not filled with the bank layer 120.

In a first example, the inside of the contact hole CH may not be filled with another material and may be in a depressed state. In this case, the second and third electrode layers are positioned on the first electrode layer 119 positioned in the contact hole CH through a follow-up process. Further, although depending on the depth of the contact hole CH, at least one of the light emitting layer and the common electrode layer may be positioned inside the contact hole CH.

In a second example, the inside of the contact hole CH may be filled with a filling layer formed of a material other than the bank layer 120. In this case, although the second and third electrode layers, the light emitting layer, and the common electrode layer are formed through a follow-up process, the structure is the same as that of the first and second embodiments. That is, only the material filling the inside of the contact hole CH may be different from the first and second embodiments.

However, the first and second examples are merely examples, and a light emitting layer may be provided in the contact hole CH portion to emit light, and the contact hole H may be formed to be flat, may be depressed downwards, or may protrude upwards as necessary according to a viewing angle, color characteristics, and the like, of the display panel.

As described above, the present disclosure has an effect of realizing an organic light emitting display apparatus having high luminance and ultra-high resolution. In addition, the present disclosure has an effect of realizing an organic light emitting display apparatus capable of solving the problem of light emission defect between adjacent subpixels due to current leakage. In addition, since the present disclosure has the wide opening including the contact hole, it is possible to realize an organic light emitting display apparatus capable of achieving high luminance and ultra-high resolution due to an increase in the light emitting area, as well as a long life. In addition, the present disclosure has an effect of realizing an organic light emitting display apparatus capable of improving outcoupling of extracted light by the light emitting and light concentrating function on the side of the bank layer.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus comprising:
a first substrate;
a first electrode layer on the first substrate;
a bank layer having an opening exposing a portion of the first electrode layer;
a bank recess in the bank layer;
a second electrode layer on the first electrode layer and the bank layer and is electrically connected to the first electrode layer;
a cover layer covering a lower surface and an inner side surface of the bank recess; and
a third electrode layer on the second electrode layer, wherein the second electrode layer and the third electrode layer cover the exposed surface of the first electrode layer and an outer side surface of the bank layer and are separated into one side and the other side with respect to the bank recess.

2. The light emitting display apparatus of claim 1, wherein the cover layer covers a portion of an end of one or more of the second electrode layer and the third electrode layer.

3. The light emitting display apparatus of claim 1, further comprising:
   a light emitting layer on the cover layer and the third electrode layer,
   wherein the light emitting layer is separated into one side and the other side with respect to the bank recess.

4. The light emitting display apparatus of claim 3, wherein one of the second electrode layer and the third electrode layer is selectively formed of a material which reflects and concentrates light generated by the light emitting layer.

5. The light emitting display apparatus of claim 1, wherein a cross-section of an outer portion of the bank layer has one selected from among a regular tapered shape, a hemispherical shape, an elliptical shape, and a mountain shape having a sloped outer surface and a flat upper surface.

6. The light emitting display apparatus of claim 1, further comprising:
   a transistor part on the first substrate; and
   a planarization layer positioned on the transistor part and having a contact hole exposing a source or drain electrode of the transistor part,
   wherein the first electrode layer is positioned on the planarization layer and connected to the source or drain electrode of the transistor part through the contact hole, and
   the contact hole is positioned in the opening.

7. The light emitting display apparatus of claim 6, wherein the contact hole includes a filling layer covering the first electrode layer and filling a depressed.

8. The light emitting display apparatus of claim 6,
   wherein the second electrode layer and the third electrode layer are positioned inside the contact hole along the first electrode layer.

9. The light emitting display apparatus of claim 6, wherein a light emitting layer is disposed in a region corresponding to the contact hole, a light is emitted in the region corresponding to the contact hole.

10. A method of manufacturing a light emitting display apparatus, the method comprising:
    forming a planarization layer on a first substrate;
    forming a first electrode layer on the planarization layer;
    forming a bank layer having an opening exposing a portion of the first electrode layer;
    forming a second electrode layer including at least one layer to cover the exposed portion of the first electrode layer and the bank layer;
    separating the second electrode layer into one side and the other side to expose a portion of the bank layer through the second electrode layer;
    etching the exposed bank layer using the second electrode layer as a mask and forming a bank recess on the bank layer; and
    forming a cover layer covering a lower surface and an inner side surface of the bank recess.

11. The method of claim 10, wherein a cross-section of the bank recess has a shape selected from among triangle, quadrangle, trapezoid, polygon, ellipse long in a horizontal direction, and T-shape rotated by 180 degrees.

12. The method of claim 10, further comprising:
    a third electrode layer on the second electrode layer,
    wherein the cover layer covers a portion of an end of one or more of the second electrode layer and the third electrode layer.

* * * * *